(12) United States Patent
Kobayashi et al.

(10) Patent No.: US 6,878,645 B2
(45) Date of Patent: Apr. 12, 2005

(54) METHOD FOR MANUFACTURING SILICON WAFER

(75) Inventors: Norihiro Kobayashi, Annaka (JP); Shoji Akiyama, Annaka (JP); Masaro Tamatsuka, Annaka (JP); Masaru Shinomiya, Annaka (JP); Yuichi Matsumoto, Annaka (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 90 days.

(21) Appl. No.: 10/332,576
(22) PCT Filed: Jul. 6, 2001
(86) PCT No.: PCT/JP01/05887
§ 371 (c)(1),
(2), (4) Date: Jan. 10, 2003
(87) PCT Pub. No.: WO02/07206
PCT Pub. Date: Jan. 24, 2002

(65) Prior Publication Data
US 2004/0023518 A1 Feb. 5, 2004

(30) Foreign Application Priority Data
Jul. 13, 2000 (JP) ........................ 2000-212583

(51) Int. Cl.$^7$ ................... H01L 21/26; H01L 21/324; H01L 21/42; H01L 21/477
(52) U.S. Cl. ................ 438/799; 438/502; 438/522
(58) Field of Search ................... 438/600–663, 438/795–799, 488–489, 293, 308, 378, 502, 509, 522, 530, 539; 427/452, 532

(56) References Cited

U.S. PATENT DOCUMENTS 4,900,694 A * 2/1990 Nakagawa ............ 438/488
5,246,886 A * 9/1993 Sakai et al. .......... 438/488
5,735,961 A 4/1998 Shimada
5,879,415 A 3/1999 Shimada

FOREIGN PATENT DOCUMENTS

| JP | 04-062840 A1 | 2/1992 |
| JP | 05-082460 A1 | 4/1993 |
| JP | 05-291269 A1 | 11/1993 |
| JP | 05-299413 A1 | 11/1993 |
| JP | 07-037831 A1 | 2/1995 |
| JP | 07-074166 A1 | 3/1995 |
| JP | 08-316163 A1 | 11/1996 |
| JP | 09-045597 A1 | 2/1997 |
| JP | 08-288232 A1 | 11/1998 |
| JP | 2000-174028 A1 | 6/2000 |

OTHER PUBLICATIONS

A copy of International Search Report for PCT/JP01/05887 mailed on Sep. 25, 2001.
International Preliminary Examination Report for PCT/JP01/05887 mailed on Jul. 10, 2003.

* cited by examiner

Primary Examiner—Carl Whitehead, Jr.
Assistant Examiner—Thanhha Pham
(74) Attorney, Agent, or Firm—Rader, Fishman & Grauer PLLC

(57) ABSTRACT

Provided is a process for manufacturing a silicon wafer employing heat treatment which is applied on the silicon wafer in inert gas atmosphere represented by Ar annealing to annihilate Grown-in defects in a surface layer region of the silicon wafer as well as to cause no degradation of haze and micro-roughness on a surface thereof. In a process for manufacturing a silicon wafer having a step of heat treating the silicon wafer in inert gas atmosphere, using a purge box with which the silicon wafer heat treated in the inert gas atmosphere can be unloaded to outside a reaction tube of a heat treatment furnace without being put into contact with the open air, the purge box is filled with mixed gas of nitrogen and oxygen or 100% oxygen gas, and the heat treated silicon wafer is unloaded into the purge box.

6 Claims, 7 Drawing Sheets

N₂ and O₂ are blown while moving boat downward (a) Centers of wafer and quartz tube are in agreement with each other 12a: Quartz tube
W: Wafer
13: Wafer boat
12: Heat treatment furnace (b) Centers of wafer and quartz tube are not in agreement with each other d: Shortest distance
12a: Quartz tube
W: Wafer
13: Wafer boat
12: Heat treatment furnace

METHOD FOR MANUFACTURING SILICON WAFER

TECHNICAL FIELD

The present invention relates to a process for manufacturing a silicon wafer (hereinafter also simply referred to as a wafer) employing heat treatment for annihilating Grown-in defects in a surface layer region of the silicon wafer and causing no degradation of haze and micro-roughness on a surface thereof.

BACKGROUND ART

While it has been known that in a CZ silicon wafer there are crystal defects referred to as so called Grown-in detects such as COP (Crystal Originated Particle) and an oxide precipitate, heat treatment performed in hydrogen atmosphere (hereinafter also referred to as hydrogen annealing) has been proposed as a method for annihilating Grown-in defects in the vicinity of a wafer surface. This heat treatment requires use of hydrogen at a high temperature of 1000° C. or higher; therefore, a safety measure is required, and an ordinary open furnace (for example, a furnace unsealed on the furnace opening side such as a horizontal furnace) cannot be used for the treatment, so that it is necessary to provide a sealing structure for enhancing air-tightness and an explosion-proof facility as a countermeasure against explosion, resulting in very high cost.

On the other hand, it has been recently found that the Grow-in defects can be annihilated in heat treatment carried out in argon atmosphere (hereinafter also referred to as Ar annealing) as in the hydrogen annealing. Since the Ar annealing has no explosiveness, a safer operation is ensured as compared with the hydrogen annealing, but it has also been known that the Ar annealing displays a characteristic behavior to a silicon wafer in contrast to the safety operation. There is given as an example of the characteristic behavior a fact that tiny pits are easily formed on a surface of a wafer subjected to the Ar annealing.

This pit formation is described as follows: An oxide film is formed by oxygen and water as very small amounts of impurities included in raw material gas or oxygen and water in the open air involved through the opening of a reaction tube during a heat treatment step or when unloading a wafer, and the oxide film further reacts with silicon (Si) according to a reaction of $SiO_2+Si\rightarrow 2SiO$; consequently Si is etched, the etched sites being observed as pits. The pits contribute to degradation of local surface roughness (micro-roughness) and long periodic surface roughness (haze) on a wafer surface. Thus, Ar gas is sensitive to a trace of impurities, and small environmental changes such as temperature fluctuations, so it has the demerit of difficulty in handling.

There are proposed the following methods for preventing such degradation of surface roughness of a wafer in the Ar annealing: one is to reduce a water concentration in raw material gas and the other is to form an etching-resistant film by treating the wafer in oxygen or nitrogen atmosphere prior to unloading it from a heat treatment furnace after the Ar annealing (JP A 93-299413).

As described in the above published patent application, however, while a nitride film is produced in nitrogen treatment at 1000° C. or higher, the nitride film produced at 1000° C. or higher has a very slow speed in HF etching, compared with an ordinary natural oxide film, and is not easily etched in cleaning with SC1 (a mixture of $NH_4OH/H_2O_2/H_2O$), SC2 (a mixture of $HCl/H_2O_2/H_2O$) or the like; therefore, it affects heat treatment in the next step. In addition, since a nitride film has a dielectric constant higher than an oxide film, in other word, a higher electrostatic capacitance, charged particles are easy to attach thereto and particles that have been once attached thereto are hard to be removed. This is a drawback when a nitride film is grown on a wafer surface.

On the other hand, tiny pits are also easily generated when switching Ar gas to oxygen gas prior to unloading a wafer after the Ar annealing. This is because, if oxygen of a prescribed amount or higher is not present in Ar gas (in other words, an oxygen concentration of a prescribed amount or lower), a region where an oxide film is formed is etched by the following reaction:

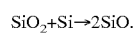

$$SiO_2+Si\rightarrow 2SiO.$$

This phenomenon inevitably occurs as a transitional one when switching Ar to oxygen. Such etching occurs when a partial pressure of oxygen is a prescribed value or lower even if oxygen is introduced after Ar is removed by a vacuum pump.

DISCLOSURE OF THE INVENTION

There occurs the problem that pits are easily generated by etching when switching Ar gas to oxygen gas not only in Ar annealing but also in annealing using other inert gas atmosphere or inert gas atmosphere including hydrogen at a content of the explosion limit (4%) or less (hereinafter simply referred to inert gas atmosphere as a general term). A wafer surface is degraded in terms of haze and micro-roughness the instant that the pits are generated. Moreover, it has been known that the micro-roughness affects an oxide film dielectric breakdown strength and mobility of electrons and holes directly under an oxide film of a transistor of a MOS structure.

Especially, as a drive frequency of a MOS transistor is higher, it is necessary to increase a mobility of carriers (electrons and holes). Furthermore, if a pit is present, concentration of an electric field occurs at the pit; there take place increase in leakage current and degradation in oxide film dielectric breakdown strength. Under these circumstances, it is necessary to reduce the pits of the Ar annealed wafer and improve haze and micro-roughness thereof.

The present invention has been made in view of the problem inherent to the prior art mentioned above, and its object is to provide a process for manufacturing a silicon wafer employing heat treatment for annihilating Grown-in defects in a surface layer region of the silicon wafer causing no degradation of haze and micro-roughness on a surface thereof, the heat treatment being applied on the silicon wafer in inert gas atmosphere represented by Ar annealing.

To solve the problem mentioned above, the present invention provides, in a first aspect, a process for manufacturing a silicon wafer having a step of heat treating the silicon wafer in inert gas atmosphere, wherein using a purge box with which the silicon wafer heat treated in the inert gas atmosphere can be unloaded to outside a reaction tube of a heat treatment furnace without being put into contact with the open air, the purge box is filled with mixed gas of nitrogen and oxygen or 100% oxygen gas, and the heat treated silicon wafer is loaded into the purge box.

In a second aspect, the present invention provides a process for manufacturing a silicon wafer having a step of heat treating the silicon wafer in inert gas atmosphere, wherein when the silicon wafer heat treated in the inert gas atmosphere is unloaded to outside a reaction tube of a heat treatment furnace, the silicon wafer is unloaded while being blown by mixed gas of nitrogen and oxygen or 100% oxygen gas.

In a third aspect, the present invention provides a process for manufacturing a silicon wafer having a step of heat treating the silicon wafer in inert gas atmosphere, wherein the heat treatment is performed in a condition that a relationship between an exhaust pressure P (mmH$_2$O) and a gas flow rate F (SLM) in a heat treatment furnace during the heat treatment in the inert gas atmosphere satisfies the following equation (1):

$$F \geq (-25/P) + 2.5 \qquad (1).$$

The shortest distance between a reaction tube of the heat treatment furnace and the silicon wafer is preferably in the range of from 10 mm to 50 mm. The reason why the upper limit of the shortest distance between the reaction tube and the silicon wafer is 50 mm is that if exceeding 50 mm, a distance between the wafer and the reaction tube (a quartz tube) is excessively large, so the quartz tube having a considerably large inner diameter relative to the wafer to be heat treated is required; there arise too big demerits such as scaling up of an apparatus and low cost-efficiency to be practical.

BEST MODE FOR CARRYING OUT THE INVENTION

Description will be given of embodiments of the present invention below together with the accompanying drawings and it is needless to say that various modifications or alterations in addition to the examples shown in the figures can be performed as far as not departing from the technical concept of the present invention.

Figure 1:
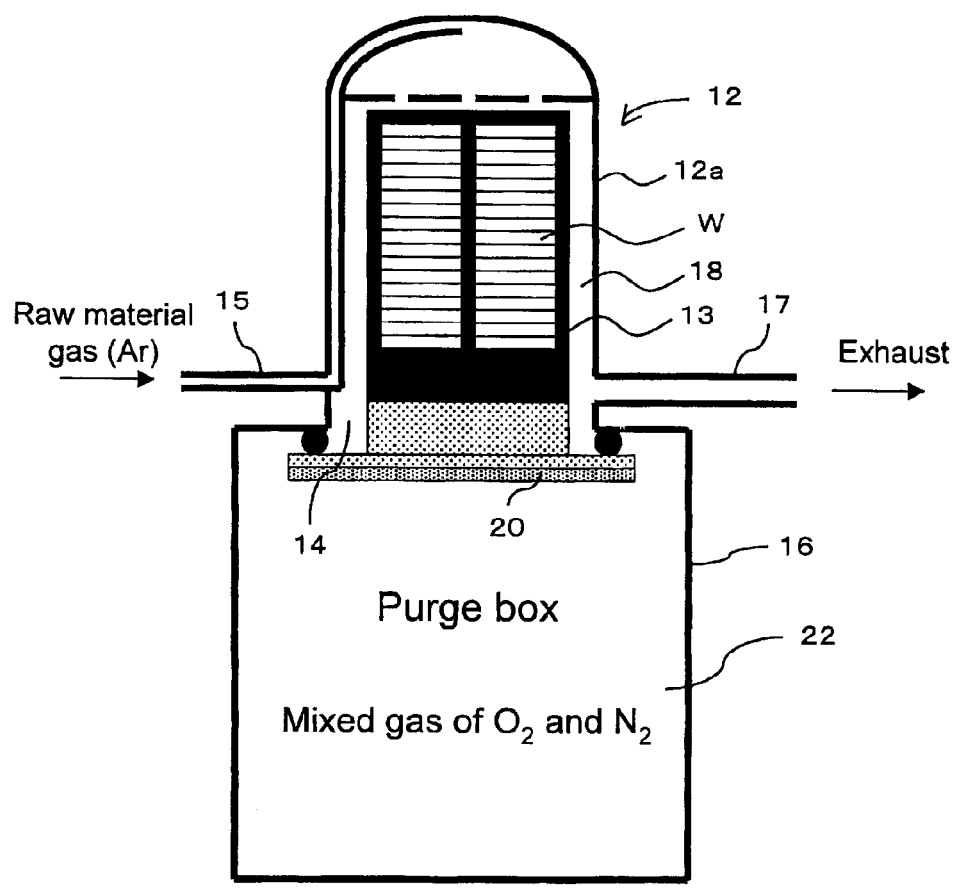
FIG. 1 is a descriptive view showing one embodiment of a first aspect of a process for manufacturing a silicon wafer of the present invention.

FIG. 1 is a descriptive view showing one embodiment of a first aspect of a process for manufacturing a silicon wafer of the present invention. In FIG. 1, a heat treatment furnace 1 is of a vertical type. The heat treatment furnace 12 has a reaction tube (a quartz tube) 12a, in which many wafers W are disposed in a wafer boat 13. On the side of a furnace opening section 14 a purge box 16 is provided. The purge box 16 is shut off from heat treatment atmosphere 18 during heat treatment of the wafers W. When a shutter 20 at a connecting section is opened in case of unloading the heat treated wafers W, heat treatment atmosphere 18 and atmosphere 22 in the purge box 16 are communicated with each other. The purge box 16 is filled with mixed gas of nitrogen and oxygen before a cover 20 is opened and the heat treated wafers W can be loaded into the purged box 16 filled with the mixed gas atmosphere 22. In FIG. 1, a reference numeral 15 designates a process (raw material) gas supply pipe and a reference numeral 17 designates an exhaust pipe.

Figure 2:
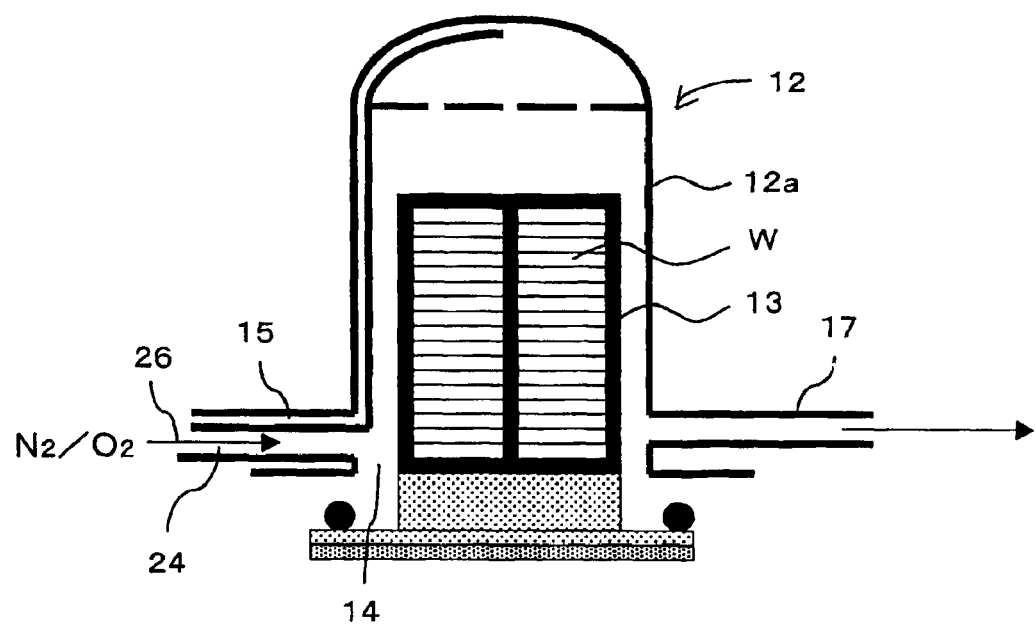
FIG. 2 is a descriptive view showing one embodiment of a second aspect of a process for manufacturing a silicon wafer of the present invention.

FIG. 2 is a descriptive view showing one embodiment of a second aspect of a process for manufacturing a silicon wafer of the present invention. A heat treatment furnace 12 in FIG. 2 is also of a vertical type. Since a structure of the heat treatment furnace 12 is similar to FIG. 1, the second description thereof is omitted. A gas supply pipe 24 is provided to a furnace opening section 14 of the heat treatment furnace 12 apart from the supply pipe 15 for the process gas (Ar gas). As shown in FIG. 2, while moving the wafer boat 13 downward in order to unload the wafers W, mixed gas 26 is supplied in approximately parallel with a wafer surface from the gas supply pipe 24. With the above construction, invasion of atmospheric air into the heat treatment furnace 12 can be effectively prevented as well as a protective film can be formed on a surface of each of the wafers W.

Figure 3:
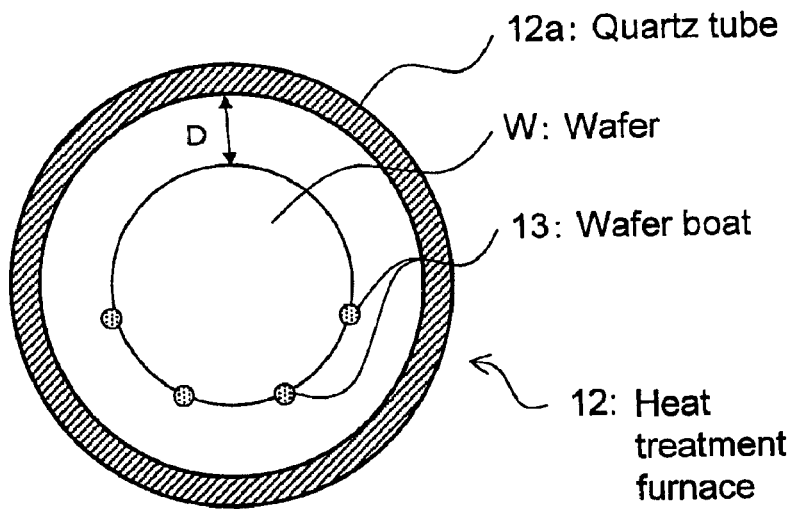
FIG. 3 is a descriptive sectional view showing a positional relationship between a wafer and a quartz tube in one embodiment of a third aspect of a process for manufacturing a silicon wafer of the present invention, wherein part (a) is of a case where the centers of the wafer and the quartz tube are in agreement with each other and part (b) is of a case where the centers are not in agreement with each other.
Figure 3:
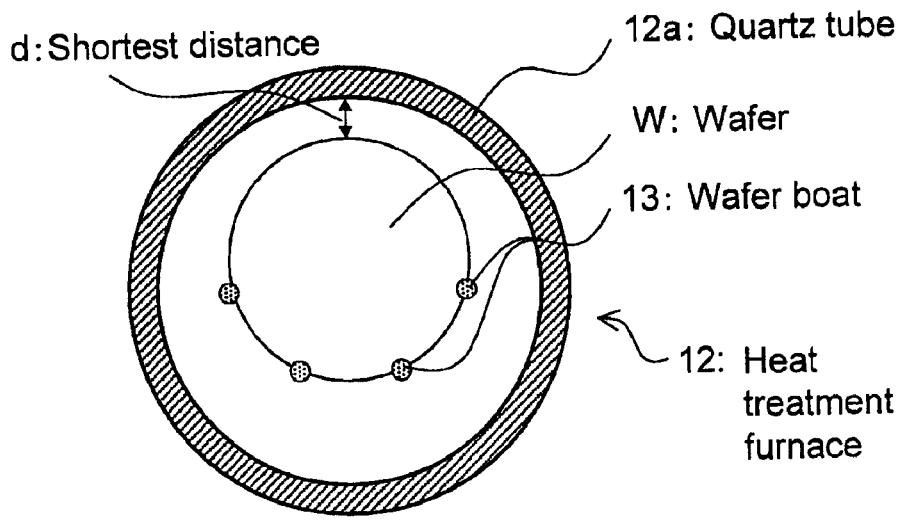

FIG. 3 is a descriptive sectional view showing a positional relationship between a wafer and a quartz tube in one embodiment of a third aspect of a process for manufacturing a silicon wafer of the present invention, wherein part (a) is of a case where the centers of the wafer and the quartz tube are in agreement with each other and part (b) is of a case where the centers are not in agreement with each other.

As described above, a process for manufacturing a silicon wafer of the third aspect of the present invention is to perform heat treatment in a condition that a relationship between an exhaust pressure P (mmH$_2$O) and a gas flow rate F (SLM) in the heat treatment furnace 12 satisfies the following equation (1):

$$F \geq (-25/P) + 2.5 \qquad (1).$$

Here, as shown in FIGS. 3(a) and (b), it was found that a distance between the outer peripheral end of each of the wafers W supported by the wafer boat 13 and the inner wall of the quartz tube 12a affects a haze level of each of the heat treated wafers W, which is shown as a concrete example in Experimental Example 4 described later.

As shown in FIG. 3(a), if a wafer W is set in the almost central portion of the quartz tube 12a, a distance D between the outer peripheral end of the wafer W and the inner wall of the quartz tube 12a is almost equal at any position. On the other hand, if a position of a wafer W set in the quartz tube 12a is displaced (the centers of the wafer W and the quartz tube 12a are displaced from each other), the shortest distance d between the wafer W and the quartz tube can be obtained. By setting the shortest distance d to a value in the range of from 10 mm to 50 mm, degradation of a haze level on the heat treated wafer W can be prevented.

Moreover, if a method for unloading a wafer in the first or second aspect is applied when the heat treated wafer is unloaded in the third aspect of the present invention, it is more effective for preventing degradation of a haze level on a wafer.

Subsequently, description will be given of the present invention in a more concrete manner taking up experimental examples.

EXPERIMENTAL EXAMPLE 1

Using silicon mirror wafers having a diameter of 150 mm, a conductivity type of p-type, a crystal axis orientation of <100> and a resistivity of 100 Ω·cm, heat treatment was performed in 100% argon atmosphere at 1200° C. for 60 min. A vertical furnace provided with a purge box similar to FIG. 1 was used.

In this Experimental Example, an influence on haze was investigated changing the mixing ratio of mixed gas composed of nitrogen and oxygen. In the heat treatment, a flow rate of argon gas was 20 SLM, an exhaust pressure was −5 mmH$_2$O and an unloading temperature was 800° C.

Haze measurement was performed with Surfscan SP1 made by KLA-tencor Corp. This measuring instrument is operated such that a wafer surface is scanned with laser light, a scattered light intensity is measured and the scattered light intensity is obtained in the unit of ppm relative to incident light. The results of the haze measurement are shown in FIG. 4.

Figure 4:
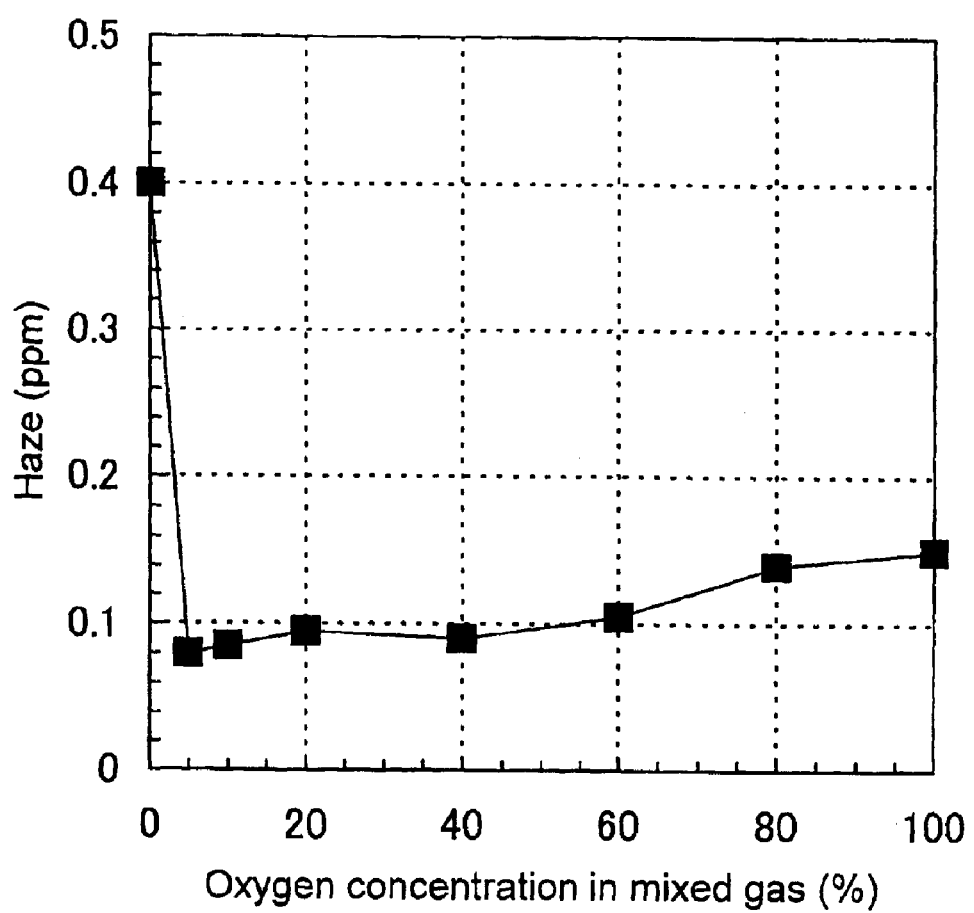
FIG. 4 is a graph showing a relationship between an oxygen concentration in mixed gas and haze on a surface of a wafer heat treated in Experimental Example 1.

From the results of FIG. 4, it has been found that in mixed gas atmosphere of nitrogen and oxygen or 100% oxygen atmosphere, a haze level is low, and the lower the oxygen concentration is, the lower the haze level becomes. However, a haze level of a wafer treated with 100% nitrogen atmosphere when unloading it was extremely high as compared with other conditions.

EXPERIMENTAL EXAMPLE 2

Instead of the method with the purge box in Experimental Example 1, using a method wherein as shown in FIG. 2 when unloading a wafer a mixed gas stream of oxygen and nitrogen was blown against the got out wafer, such an experiment as Experimental Example 1 was conducted to investigate haze levels of the got out wafers.

In this Experimental Example, an influence on haze was investigated changing the mixing ratio of mixed gas blown against the unloaded wafer. The results of the haze measurement are shown in FIG. 5.

Figure 5:
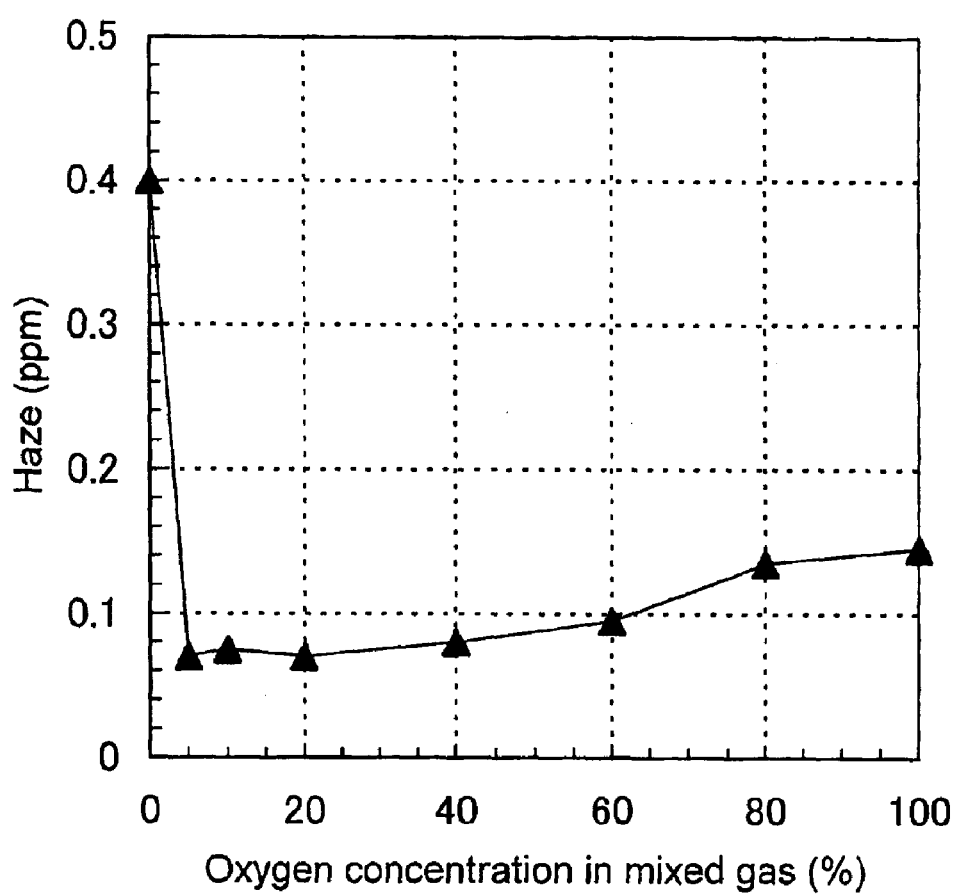
FIG. 5 is a graph showing a relationship between an oxygen concentration in mixed gas to be blown against an unloaded wafer and haze on a surface of the heat treated wafer in Experimental Example 2.

From the results of FIG. 5, it has been found that if the blowing gas stream is of mixed gas of nitrogen and oxygen or 100% oxygen atmosphere, a haze level is low, and the lower the oxygen concentration is, the lower the haze level becomes. However, a haze level of a wafer treated with 100% nitrogen atmosphere when unloading it was extremely high as compared with other conditions.

As described above, both of Experimental Examples 1 and 2 showed the phenomenon that in mixed gas of nitrogen and oxygen or 100% oxygen atmosphere, a haze level is low, and in 100% nitrogen atmosphere, a haze level is high. The following is considered as the cause of the above phenomenon.

The reason why tiny pits are easy to occur when switching the gas from Ar gas to oxygen gas before unloading the Ar annealed wafer is that since oxygen of a prescribed amount or more is not present in Ar gas as described above, in a region where an oxide film is formed the following reaction occurs to etch the region:

$SiO_2 + Si \rightarrow 2SiO$.

This phenomenon inevitably occurs as a transitional one when switching the gas from Ar to oxygen. Therefore, it is estimated that as in the Experimental Examples 1 and 2, using a method wherein a wafer is loaded directly into the atmosphere containing oxygen of a certain concentration (a partial pressure) with the purge box or another method wherein a gas stream containing oxygen is directly blown against a wafer, a sufficient protective oxide film is formed by oxygen gas at a certain partial pressure; therefore, a haze level is effectively reduced, while using 100% nitrogen atmosphere instead of the above atmosphere, a nitride film as a protective film is insufficiently formed because of an unloading temperature of 800° C. and water as a trace of impurity included in the nitrogen gas causes the above reaction locally; a haze level is degraded in this Experimental Example. Furthermore, when an oxygen concentration of mixed gas atmosphere of nitrogen and oxygen is less than 1%, it has been experimentally confirmed that while degradation in haze level does not occur sometimes, there increase variations in haze level on a wafer and between heat treated batches. Therefore, an oxygen concentration in mixed gas atmosphere is preferably 1% or higher.

EXPERIMENTAL EXAMPLE 3

Using silicon mirror wafers having a diameter of 150 mm, a conductivity type of p-type, a crystal axis orientation of <100> and a resistivity of 10 Ω·cm, heat treatment was performed in 100% argon atmosphere at 1200° C. for 60 min, a gas flow rate and an exhaust pressure in the heat treatment having been changed. There was used a heat treatment furnace of a general vertical type and the loading and unloading temperature of a wafer was 600° C. An inner diameter of a quartz tube of the used heat treatment furnace is 220 mm and a wafer is set so as to be in the central portion thereof.

An exhaust pressure during the heat treatment is defined as a pressure differential (a pressure differential relative to the atmospheric pressure) between a pressure sensor installed in the vicinity of an exhaust port of the furnace and a pressure sensor installed outside the furnace. As the experimental conditions, a gas flow rate F was set in the range of from 3 to 30 (SLM) and an exhaust pressure P was set in the range of from −5 to −25 (mmH$_2$O). Note that 1 SLM (Standard Liter per Minute) designates a flow rate when a gas of 1 liter in the standard condition flows for 1 min.

Figure 6:
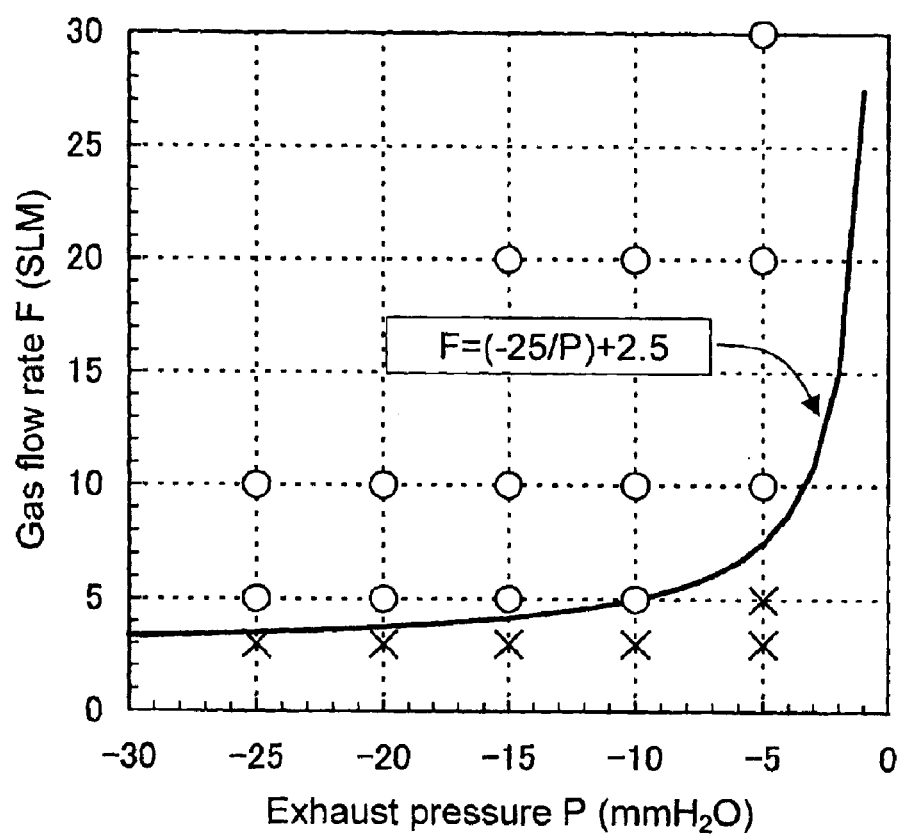
FIG. 6 is a graph showing a relationship between an exhaust pressure P and a gas flow rate F during heat treatment in Experimental Example 3.

The heat treated wafer was observed under the collimated light and a haze level was investigated according to whether or not cloudiness was observed in a peripheral portion of the wafer. The results of the investigation are shown in Table 1. In addition, the results in Table 1 were plotted to make a graph to obtain a boundary line between the presence or absence of cloudiness in the peripheral portion, with the finding that the boundary line is expressed approximately by the following equation (FIG. 6):

$$F = (-25/P) + 2.5.$$

Note that while the reason why a difference in occurrence of the cloudiness in the wafer peripheral portion exists according to a relationship between a gas flow rate and an exhaust pressure is not clear, it is considered that a gas flow in the vicinity of the wafer peripheral portion affects pit formation due to etching. That is, it is estimated that if a negative pressure of an exhaust pressure relative to the atmospheric pressure becomes higher, a gas flow smoothes even at a smaller gas flow rate, while if the negative pressure is low, gas is apt to be stagnant in a vortex in the vicinity of the peripheral portions between the wafers unless a gas flow rate is increased to a certain extent; therefore, pits are easily formed only in the wafer peripheral portion.

TABLE 1

|  |  | Exhaust pressure P (mmH$_2$O) | | | | |
| --- | --- | --- | --- | --- | --- | --- |
|  |  | −25 | −20 | −15 | −10 | −5 |
| Gas flow rate F (SLM) | 3 | X | X | X | X | X |
|  | 5 | O | O | O | O | X |
|  | 10 | O | O | O | O | O |
|  | 20 | — | — | O | O | O |
|  | 30 | — | — | — | — | O |

Evaluation by observation in Table 1 is defined as follows: O; no cloudiness in the peripheral portion, X; occurrence of cloudiness in the peripheral portion, and -; no experiment performed.

EXPERIMENTAL EXAMPLE 4

Two parameter values F=10 SLM and P=−15 mmH$_2$O were selected among combinations of the exhaust pressures P and the gas flow rates F in Table 1 of Experimental Example 3 and a relationship between the shortest distance from a wafer to a quartz tube and a haze level was investigated. Specifically, since in Experimental Example 3, a wafer was set almost in the central portion of a quarts tube, a distance D between an outer peripheral end of the wafer and an inner wall of the quartz tube was almost uniformly 35 mm at any point as shown in FIG. 3(a), while in this Experimental Example, a position at which a wafer was set in the quartz tube was displaced (the centers of the wafer and the quartz tube was displaced from each other) to thereby change the shortest distance d between the wafer and the quartz tube in the range of from about 2.5 to 30 mm. Under the various shortest distances the wafers were heat treated. Haze levels on the heat treated wafers were investigated. The results of the investigation are shown in FIG. 7.

Figure 7:
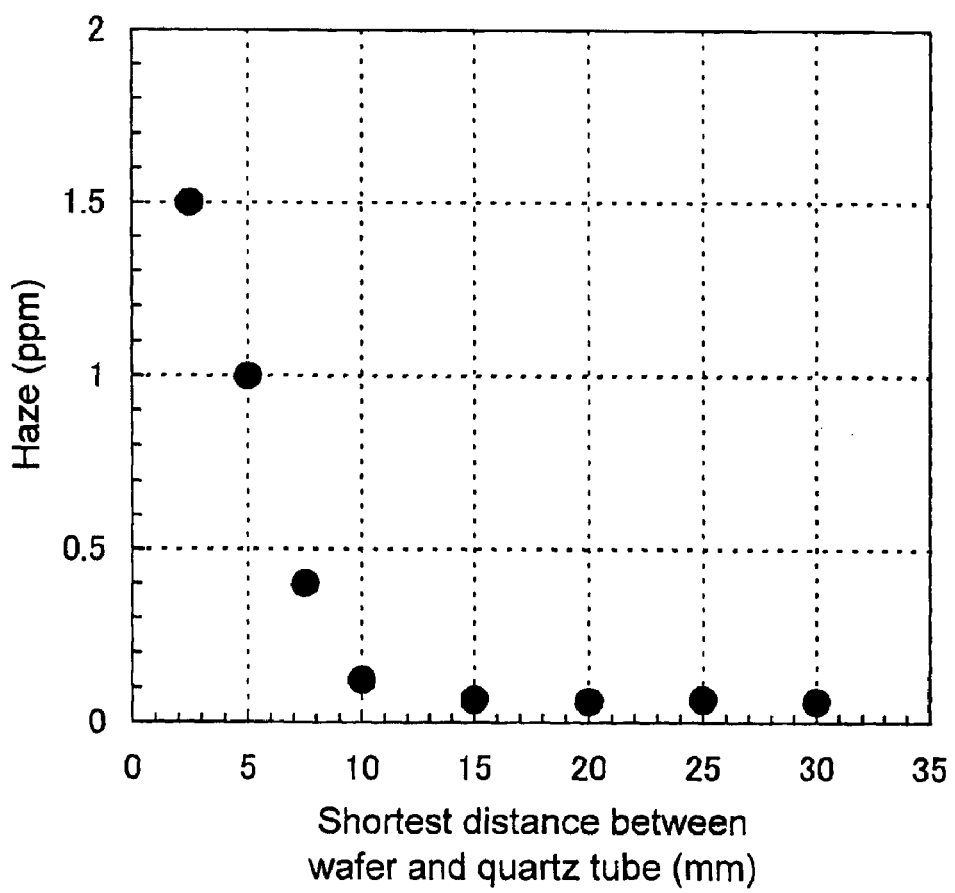
FIG. 7 is a graph showing a relationship between the shortest distance from a wafer to a quartz tube and haze on a surface of a wafer heat treated in Experimental Example 4.

From the results of FIG. 7, it has been found that a haze level on the heat treated wafer is related to the shortest distance between the wafer and the quartz tube and the haze level on the wafer is extremely degraded at the distance of 10 mm or less. While a cause of this phenomenon is not clear, it is expected that a gas flow in the vicinity of a wafer peripheral portion exerts an effect on pit formation due to etching as in Experimental Example 3.

CAPABILITY OF EXPLOITATION IN INDUSTRY

As described above, according to the present invention, an effect can be achieved that heat treatment in inert gas atmosphere represented by Ar annealing is applied on a silicon wafer to annihilate Grown-in defects in a wafer surface layer region as well as to cause no degradation of haze and micro-roughness on a surface thereof.

What is claimed is:

1. A process for manufacturing a silicon wafer having a step of heat treating the silicon wafer in inert gas atmosphere, wherein the heat treatment is performed in a condition that a relationship between an exhaust pressure P (mmH$_2$O) and a gas flow rate F (SLM) in a heat treatment furnace during the heat treatment in the inert gas atmosphere satisfies the following equation:

$$F \geq (-25/P) + 2.5$$

wherein said exhaust pressure P is defined as a pressure differential between a pressure sensor installed at an exhaust port of the heat treatment furnace and a pressure sensor installed outside the heat treatment furnace.

2. A process for manufacturing a silicon wafer according to claim 1, wherein in the heat treatment, the shortest distance between a reaction tube of the heat treatment furnace and the silicon wafer is in the range of from 10 mm to 50 mm.

3. A process for manufacturing a silicon wafer according to claim 1, including using a purge box with which the silicon wafer heat treated in the inert gas atmosphere is unloaded to outside a reaction tube of the heat treatment furnace without being put into contact with the open air, the purge box is filled with mixed gas of nitrogen and oxygen or 100% oxygen gas, and the heat treated silicon wafer is loaded into the purge box.

4. A process for manufacturing a silicon wafer according to claim 1, including when the silicon wafer heat treated in the inert gas atmosphere is unloaded to outside a reaction tube of the heat treatment furnace, the silicon wafer is unloaded while being blown by mixed gas of nitrogen and oxygen or 100% oxygen gas.

5. A process for manufacturing a silicon wafer according to claim 1, wherein the heat treatment of the silicon wafer in inert gas atmosphere is performed at a high temperature of 1000° C. or higher.

6. A process for manufacturing a silicon wafer according to claim 1, wherein the heat treatment of the silicon wafer in inert gas atmosphere is performed to a plurality of the silicon wafers as a batch.

* * * * *